(12) United States Patent
Cejnar

(10) Patent No.: US 11,558,050 B2
(45) Date of Patent: Jan. 17, 2023

(54) SWITCHING ARRANGEMENT

(71) Applicant: Eaton Intelligent Power Limited, Dublin (IE)

(72) Inventor: Pavel Cejnar, Turnov (CZ)

(73) Assignee: EATON INTELLIGENT POWER LIMITED, Dublin (IE)

( * ) Notice: Subject to any disclaimer, the term of this patent is extended or adjusted under 35 U.S.C. 154(b) by 0 days.

(21) Appl. No.: 17/495,817

(22) Filed: Oct. 7, 2021

(65) Prior Publication Data
US 2022/0116034 A1    Apr. 14, 2022

(30) Foreign Application Priority Data
Oct. 9, 2020    (GB) ...................................... 2016017

(51) Int. Cl.
*H03K 17/60*    (2006.01)
(52) U.S. Cl.
CPC ..................... *H03K 17/60* (2013.01)
(58) Field of Classification Search
CPC ................. H03K 17/08; H03K 17/081; H03K 17/08108; H03K 17/60; H03K 17/72; H03K 17/74; H02H 3/08; H02H 3/081; H02H 3/087
See application file for complete search history.

(56) References Cited

U.S. PATENT DOCUMENTS 5,793,586 A    8/1998 Rockot et al.
2017/0093185 A1*    3/2017 Eckert .................. H02J 7/0016

FOREIGN PATENT DOCUMENTS

EP           3236572 A1 *  10/2017
WO    WO 2015028634 A1     3/2015

* cited by examiner

*Primary Examiner* — Long Nguyen
(74) *Attorney, Agent, or Firm* — Leydig, Voit & Mayer, Ltd.

(57) ABSTRACT

A switching arrangement for switching off an electric current with a high slew rate, especially a short-circuit current, includes a main line with a first SCR-arrangement including at least a first SCR and a first reverse conducting diode arranged in parallel to the first SCR, and a first bypass line connected to the main line and arranged in a parallel way to the first SCR-arrangement. The first bypass line includes a second SCR-arrangement comprising at least a second SCR arranged in the same polarity as the first reverse conducting diode. The first bypass line further includes at least one capacitor and a DC-voltage source connected to the capacitor for pre-charging the capacitor.

9 Claims, 2 Drawing Sheets

SWITCHING ARRANGEMENT

CROSS-REFERENCE TO PRIOR APPLICATION

Priority is claimed to British Patent Application No. GB 2016017.2, filed on Oct. 9, 2020, the entire disclosure of which is hereby incorporated by reference herein.

FIELD

The present disclosure relates to a switching arrangement, and, in particular, to a switching arrangement for switching off an electric current with high slew rate.

BACKGROUND

Modern circuit breakers comprise today more and more often semiconductor switching arrangements for switching off electric currents even under fault conditions, especially short circuits. Such circuit breakers could be hybrid arrangements, for example described in WO 2015/028634 A1 by the applicant, or solid state circuit breakers. Hybrid circuit breakers use semiconductor elements only for switching operations. The current does not pass semiconductors in standard on-operation. An advantage of this design is the low resistance of these breakers and the low voltage drop and so losses. A drawback is a need for an ultra-fast mechanic switch in the main line, this mechanical switch causes delay, anyway.

Solid state circuit breakers do not need an ultra-fast mechanic switch in the main line. However, a typical problem of solid state circuit breakers is the resistance in usual operation, caused by at least one switching semiconductor arranged in the main line. The current has to pass this semiconductor. The resistance causes a significant voltage drop and so heating of the circuit breaker. The heat has to be dissipated. Frequent thermal rippling also lowers the lifetime of semiconductor elements.

SUMMARY

In an embodiment, the present invention provides a switching arrangement for switching off an electric current with high slew rate, especially a short-circuit current. The switching arrangement includes a main line with a first SCR-arrangement including at least a first SCR and a first reverse conducting diode arranged in parallel to the first SCR. The switching arrangement further includes a first bypass line connected to the main line and arranged in a parallel way to the first SCR-arrangement. The first bypass line includes a second SCR-arrangement having at least a second SCR arranged in the same polarity as the first reverse conducting diode. The first bypass line further includes at least one capacitor and a DC-voltage source connected to the capacitor for pre-charging the capacitor.

BRIEF DESCRIPTION OF THE DRAWINGS

The present invention will be described in even greater detail below based on the exemplary figures. The invention is not limited to the exemplary embodiments. Other features and advantages of various embodiments of the present invention will become apparent by reading the following detailed description with reference to the attached drawings which illustrate the following.

DETAILED DESCRIPTION

Figure 1:
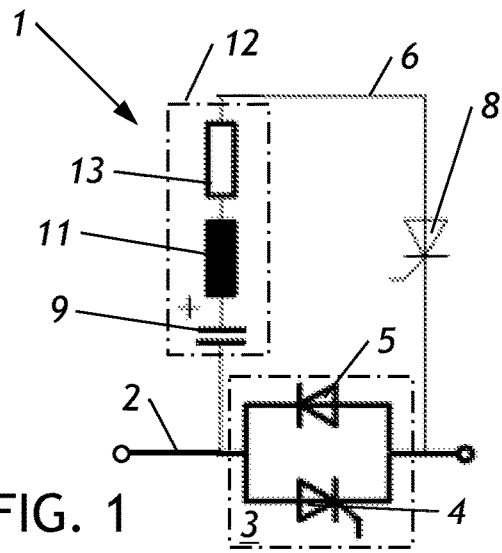
FIG. 1 illustrates a first preferred embodiment of an actual switching arrangement for unipolar current switching operation.

In an embodiment, the present invention overcomes the drawbacks of the state of the art by providing a switching arrangement with low on state losses and the capability of switching off high rising currents.

As a result, the switching arrangement has the ability to switch high currents, even high rising short circuit currents. An SCR thyristor (later in the text just SCR) has very low resistance in the on state, causing low voltage drop and so low losses at high currents compared to even unipolar or bipolar transistors. As a result, the switching arrangement 1 has a low tendency for heating up. SCR has very high blocking/reverse voltages and very good overload capability. However, the switching off the procedure of SCR-arrangements according to the state of the art is complicated, because SCR doesn't have its own switch-off capability, and therefore is not applicable for simple use in circuit breakers 21. The actual switching arrangement 1 can be switched off in a short time and is able to switch off currents high slew rates of a few 1000 A/s, especially short circuit currents.

The switching arrangement is suitable even for solid state circuit breakers or hybrid circuit breakers.

FIGS. 1 to 4 show preferred embodiments of a switching arrangement 1 for switching off an electric current with a high slew rate, especially a short-circuit current, the switching arrangement 1 comprises:

a main line 2 with a first SCR-arrangement 3 comprising at least a first SCR 4 and a first reverse conducting diode 5 arranged in parallel to the first SCR 4, a first bypass line 6 connected to the main line 2 and arranged in a parallel way to the first SCR-arrangement 3, the first bypass line 6 comprises a second SCR-arrangement 7 comprising at least a second SCR 8 arranged in the same polarity as the first reverse conducting diode 5, the first bypass line 6 further comprises at least one capacitor 9 and a DC-voltage source 10 connected to the capacitor 9 for pre-charging the capacitor 9.

As a result, the switching arrangement has the ability to switch high currents, even high rising short circuit currents. An SCR thyristor (later in the text just SCR) has very low resistance in the on state, causing low voltage drop and so low losses at high currents compared to even unipolar or bipolar transistors. As a result, the switching arrangement 1 has a low tendency for heating up. SCR has very high blocking/reverse voltages and very good overload capability. However, the switching off procedure of SCR-arrangements according to the state of the art is complicated, because SCR doesn't have its own switch-off capability, and not applicable for simple use in circuit breakers 21. The actual switching arrangement 1 can be switched off in a short time and is able to switch off currents high slew rates of a few 1000 A/s, especially short circuit currents. SCR is the common shortcut for silicon controlled rectifier. An SCR is a type of thyristor.

Figure 5:
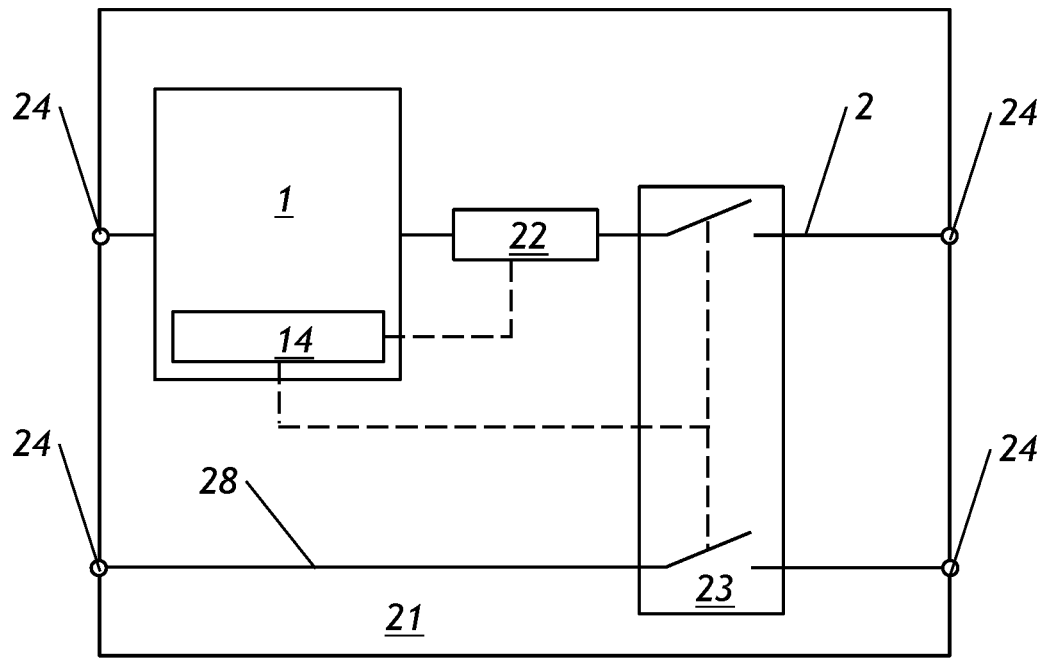
FIG. 5 is a block diagram of a solid state circuit breaker with an actual switching arrangement.

The switching arrangement 1 is suitable for solid state circuit breakers 21. FIG. 5 shows a block diagram of a solid state circuit breaker 21 comprising an actual switching arrangement 1. The circuit breaker further comprises clamping devices 24 and galvanic separation relays 23 or disconnectors. The circuit breaker according to FIG. 5 comprise two lines 2, 28. However, the circuit breaker may comprise a different number of lines.

The switching arrangement 1 is also suitable for the use in devices different from a circuit breaker 1.

The switching arrangement 1 is suitable for switching off an electric current with a high slew rate, especially a short-circuit current. Preferably a high slew rate is a slew rate higher than 1000 A/s, especially higher than 10,000 A/s, particularly preferred higher than 100,000 A/s.

Figure 4:
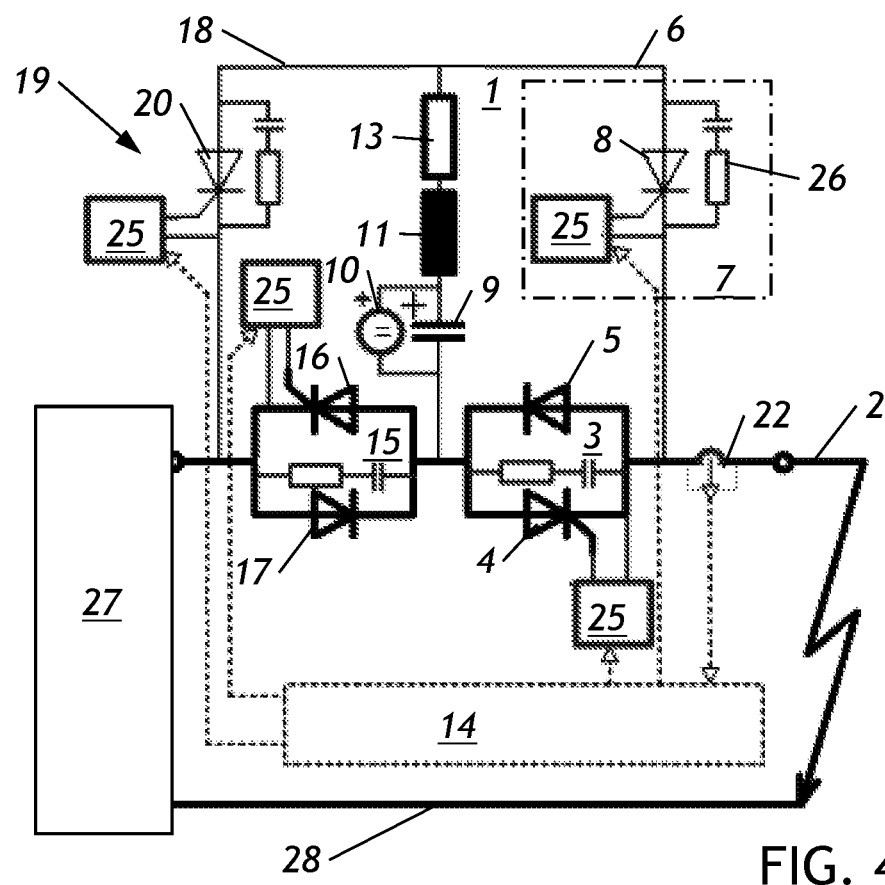
FIG. 4 illustrates the second preferred embodiment of an actual switching arrangement which depict additional features to carry out the switching arrangement.

The switching arrangement 1 comprises a first SCR-arrangement 3 arranged in a main line 2. The first SCR-arrangement 3 comprises at least a first SCR 4 and a first reverse conducting diode 5. As usual the first reverse conducting diode 5 is arranged in parallel to the first SCR 4 with different polarities. According to the preferred real embodiment, the first SCR-arrangement 3 further comprises a snubber circuit 26 and a driver unit 25, as shown in FIG. 4. These are standard components which are typically used for semiconductor switching arrangements.

A first bypass line 6 is connected to the main line 2. The first bypass line 6 is arranged in a parallel way to the first SCR-arrangement 3 and bypasses the first SCR-arrangement 3. In the first bypass line 6, a second SCR-arrangement 7 is arranged. The second SCR-arrangement 7 comprises at least a second SCR 8 which is arranged in the same polarity as the first reverse conducting diode 5, as can be seen in FIGS. 1 to 4. The second SCR-arrangement 7 further comprises a snubber circuit 26 and a driver unit 25, as shown in FIG. 4. These are standard components which are typically used for most semiconductor switching arrangements.

The first bypass line 6 further comprises at least one capacitor 9. A DC-voltage source 10 is connected to capacitor 9. The DC-voltage source 10 is preferably controllable. This means it can be at least connected or disconnected to the capacitor 9. The DC-voltage source 10 charges the capacitor 9 and holds it in a charged state.

Particularly the presence of voltage on capacitor 9 is checked all the time in order to ensure the switch-off capability of the switching arrangement 1—in case of voltage drop control system 14 leads the switching arrangement 1 in safe off state.

The switching arrangement 1 comprises a control unit 14 as shown in FIGS. 4 and 5. The control unit 14 is connected to the first and second SCR 4, 8 respective their driver units 25. The control unit 14 is also connected to the DC-voltage source 10 respective a switch for disconnection the DC-voltage source 10 from the capacitor 9.

In the on state of the switching arrangement 1 the control unit 14 provides the first SCR 4 with a switch on signal or potential. In the case of AC, the control unit 14 or the driver unit 25 provides the first SCR 4 with a pulse signal. It is obvious that the embodiment according to FIG. 1 is only suitable for DC one direction switching-off capability. The embodiment according to FIGS. 2 to 4 can be used also in an AC grid.

For switching off the switching arrangement 1 the control unit 14 first switches on the second SCR 8 and stops sending pulses to the first SCR 4 by providing the driver units 25 with appropriate signals. The control unit 14 further switches off the DC-voltage source 10 respective disconnects it from the capacitor 9 if it is required by the design of the DC-voltage source 10. Another way is the current limiting capability of the DC-voltage source 10, which doesn't require disconnection. The capacitor 9 discharges now via the first bypass line 6. The current in the first bypass line 6 at the beginning of the switch off operation has to be higher than the current in the main line 2. The first SCR 4 changes into the blocking state. As the capacitor 9 is disconnected from the DC-voltage 10 source or separated by a high impedance, the capacitor 9 discharges, and the current of main line 2 can be completely switched off by commutating the second SCR 8 into the reverse polarity.

It has been shown that current in the first bypass line 6 higher to the current of main line 2 for the switch off procedure is important. According to a preferred embodiment, the first bypass line 6 further comprises at least one inductance 11 arranged in series to the capacitor 9. The capacitor 9 and the inductance 11 build a resonant circuit 12. Abrupt current changes, like a step, cause the resonant circuit 12 to start oscillating with its natural or resonant frequency, causing a resonance rise of the current in the first bypass line 6. This ensures that the current in the first bypass line 6 is higher than the current in the main line 2 outside the bypassed part.

According to a further preferred embodiment, the resonant circuit 12 further comprises at least one resistor 13. The resistor 13 does not affect the resonance frequency but the damping and the time constant and lowers the time necessary for the switching off procedure.

Alternatively, the resistance of the inductance 11 can be used for this purpose.

Figure 2:
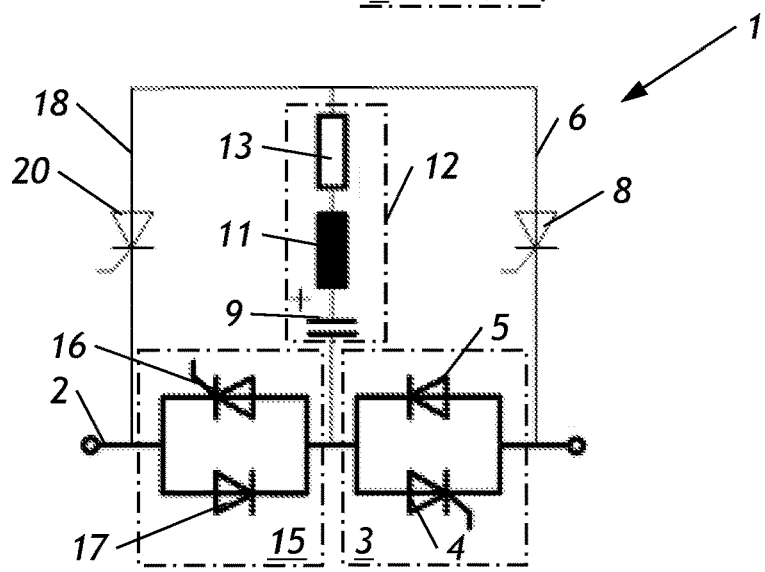
FIG. 2 illustrates a second preferred embodiment of an actual switching arrangement.
Figure 3:
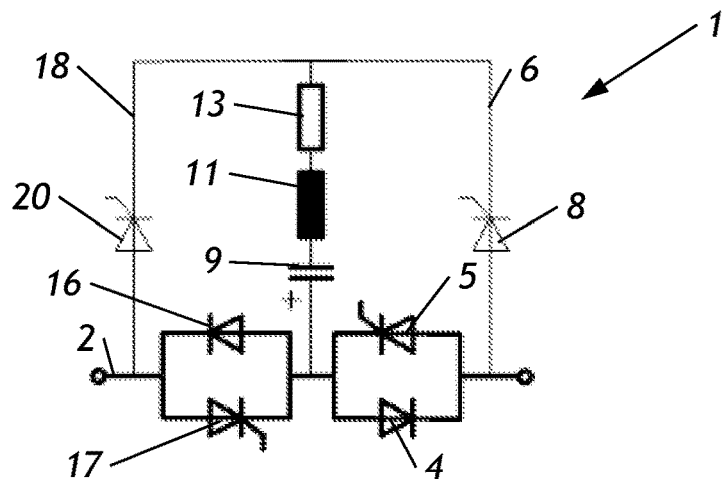
FIG. 3 illustrates a third preferred embodiment of an actual switching arrangement.

The embodiments according to FIGS. 2 to 4 comprise further components compared to the embodiment according to FIG. 1. According to these embodiments, the main line 2 further comprises a third SCR-arrangement 15 comprising at least a third SCR 16 and a third reverse conducting diode 17 arranged in parallel to the third SCR 16. The third SCR-arrangement 15 further comprises the usual driver unit 25 and a snubber circuit 26, as only shown in FIG. 4. The third SCR-arrangement 15 is arranged in the main line 2 with a polarity contrary to a polarity of the first SCR-arrangement 3. The embodiments according to FIG. 2 and FIG. 3 only differ regarding the polarity. Please note that the denomination "third" reverse conducting diode 17 is chosen because it is part of the third SCR-arrangement 15 and that no second reverse conducting diode is part of the described switching arrangement.

The switching arrangement 1 further comprises a second bypass line 18 connected to the main line 2 and arranged in a parallel way to the third SCR-arrangement 15. The second bypass line 18 comprises a fourth SCR-arrangement 19 comprising at least a fourth SCR 20 arranged in the same polarity as the third reverse conducting diode 17.

In principal the second bypass line 18 could be embodied as a complete mirror of the first bypass line 6, with a separate second capacitor and a separate second DC-voltage source, and the further preferred components. However, it is not necessary to provide the switching arrangement 1 with these components. According to the preferred embodiments as shown in FIGS. 2 to 4 it is suggested that the second bypass line 18 connects the first bypass line 6 at a point, that the capacitor 9 is part of the first bypass line 6 and the second bypass line 18. Dependent on the polarity of the voltage either the first bypass line 6 or the second bypass line 18 is live. So it is not necessary to provide a second capacitor and a second CD-voltage source.

According to the preferred embodiments the first bypass line 6 comprises the resonant circuit 12 and the second bypass line 18 is connected to the first bypass line 6 at a point or in a way that the resonant circuit 12 is part of the first bypass line 6 and the second bypass line 18. The advantages of the resonant circuit 12 are already described. Also, further resistance 13 can be implemented, as shown in FIGS. 2 to 4.

The control unit 14 is also connected to the third SCR 16 and the fourth SCR 20 respective the individual driver units 15. For switching off the switching arrangement 1 according to one of FIGS. 2 to 4 the control unit 14 first switches on the second SCR 8 and the fourth SCR 20, and blocks the pulses to the first SCR 4 and the third SCR 16. Afterward the control unit 14 further switches off the DC-voltage source 10, if necessary. The switch off procedure is already described.

In order to reduce the amount of energy stored in capacitor 9 for switch off procedure, the control unit 14 can sense the direction of the current of main line 2 by current sensor 22. Depending on current sense, and it can switch on just one of the second SCR 8 or the fourth SCR 20. Besides the positive effect of lower energy, it reduces down also the current and thermal load of the first SCR 4 or the third SCR 16.

FIG. 4 further shows a grid source 27.

The following are principles for understanding and interpreting the actual disclosure.

Features are usually introduced with an indefinite article "one, a, an". Unless otherwise stated in the context, therefore, "one, a, an" is not to be understood as a number word. The terms used in the claims should be construed to have the broadest reasonable interpretation consistent with the foregoing description. For example, the use of the article "a" or "the" in introducing an element should not be interpreted as being exclusive of a plurality of elements.

The binding word "or" is to be interpreted as inclusive and not as exclusive. Unless the context dictates otherwise, "A or B" also includes "A and B", where "A" and "B" represent any features. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

By means of an ordering number word, for example, "first", "second" or "third", in particular, a feature X or an object Y are distinguished in several embodiments, unless otherwise defined by the disclosure of the invention. In particular, a feature X or object Y with an ordering number word in a claim does not mean that an embodiment of the invention covered by this claim must have a further feature X or another object Y.

An "essentially" in conjunction with a numerical value includes tolerance of ±10% around the given numerical value unless the context dictates otherwise.

For ranges of values, the endpoints are included, unless the context dictates otherwise.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

What is claimed is:

1. A switching arrangement for switching off an electric current with high slew rate, the switching arrangement comprising:
   a main line with a first SCR-arrangement comprising at least a first SCR and a first reverse conducting diode arranged in parallel to the first SCR,
   a first bypass line connected to the main line and arranged in a parallel way to the first SCR-arrangement,
   the first bypass line comprising a second SCR-arrangement comprising at least a second SCR arranged in the same polarity as the first reverse conducting diode,
   the first bypass line further comprising at least one capacitor and a DC-voltage source connected in parallel with the capacitor for pre-charging the capacitor,
   wherein the first bypass line further comprises at least one inductor arranged in series to the DC-voltage source that is connected in parallel with the capacitor, and wherein the capacitor and the inductor form a resonant circuit.

2. The switching arrangement according to claim 1, wherein the resonant circuit further comprises at least one resistor.

3. The switching arrangement according to claim 1, further comprising a control unit which is connected to the first SCR, the second SCR and the DC-voltage source, and wherein the control unit is configured to switch off the switching arrangement by first switching on the second SCR and switching off the first SCR, and then switch off the DC-voltage source.

4. The switching arrangement according to claim 1, wherein the main line further comprises a third SCR-arrangement comprising at least a third SCR and a third reverse conducting diode arranged in parallel to the third SCR, and that the third SCR-arrangement is arranged in the main line with a polarity contrary to a polarity of the first SCR-arrangement, the switching arrangement further comprising a second bypass line connected to the main line and arranged in a parallel way to the third SCR-arrangement, and the second bypass line comprising a fourth SCR-arrangement comprising at least a fourth SCR arranged in the same polarity as the third reverse conducting diode.

5. The switching arrangement according to claim 4, wherein the second bypass line is connected to the first bypass line, with the capacitor being part of the first bypass line and of the second bypass line.

6. The switching arrangement according to claim 4, wherein the second bypass line is connected to the first bypass line, with the resonant circuit being part of the first bypass line and of the second bypass line.

7. The switching arrangement according to claim 4, wherein the control unit is connected to the third SCR and the fourth SCR, and wherein the control unit is configured to switch off the switching arrangement by first switching on the second SCR and the fourth SCR, and switching off the first SCR and the third SCR, and then switching off the DC-voltage source.

8. A circuit breaker with the switching arrangement according to claim 1.

9. A switching arrangement for switching off an electric current with high slew rate, the switching arrangement comprising:
- a main line with a first SCR-arrangement comprising at least a first SCR and a first reverse conducting diode arranged in parallel to the first SCR,
- a first bypass line connected to the main line and arranged in a parallel way to the first SCR-arrangement,
- the first bypass line comprising a second SCR-arrangement comprising at least a second SCR arranged in the same polarity as the first reverse conducting diode,
- the first bypass line further comprising at least one capacitor and a DC-voltage source connected to the capacitor for pre-charging the capacitor,
- the main line further comprising a third SCR-arrangement comprising at least a third SCR and a third reverse conducting diode arranged in parallel to the third SCR, and that the third SCR-arrangement is arranged in the main line with a polarity contrary to a polarity of the first SCR-arrangement,
- a second bypass line connected to the main line and arranged in a parallel way to the third SCR-arrangement, and
- the second bypass line comprising a fourth SCR-arrangement comprising at least a fourth SCR arranged in the same polarity as the third reverse conducting diode.

* * * * *